United States Patent
Pan et al.

(10) Patent No.: US 9,349,461 B1
(45) Date of Patent: May 24, 2016

(54) APPLYING SUBSTANTIALLY THE SAME VOLTAGE DIFFERENCES ACROSS MEMORY CELLS AT DIFFERENT LOCATIONS ALONG AN ACCESS LINE WHILE PROGRAMMING

(71) Applicant: MICRON TECHNOLOGY, INC., Boise, ID (US)

(72) Inventors: Feng Pan, Fremont, CA (US); Ramin Ghodsi, San Jose, CA (US)

(73) Assignee: Micron Technology, Inc., Boise, IA (US)

( * ) Notice: Subject to any disclaimer, the term of this patent is extended or adjusted under 35 U.S.C. 154(b) by 0 days.

(21) Appl. No.: 14/558,900

(22) Filed: Dec. 3, 2014

(51) Int. Cl.
  *G11C 11/34* (2006.01)
  *G11C 16/10* (2006.01)

(52) U.S. Cl.
  CPC ...................................... *G11C 16/10* (2013.01)

(58) Field of Classification Search
  CPC .... G11C 5/142; G11C 16/0483; G11C 11/39; G11C 16/04; G11C 16/10; G11C 11/5621; G11C 16/0466; G11C 16/3418; G11C 16/3427; G11C 11/5671; G11C 16/12; G11C 8/08
  USPC ............. 365/185.17, 185.02, 185.18, 185.19, 365/185.28, 185.23, 185.11, 185.24, 185.29
  See application file for complete search history.

(56) References Cited

U.S. PATENT DOCUMENTS

| | | | |
|---|---|---|---|
| 7,292,476 B2 | 11/2007 | Goda et al. | |
| 7,630,246 B2 | 12/2009 | Roohparvar | |
| 8,385,123 B2 | 2/2013 | Jones | |
| 2008/0037327 A1* | 2/2008 | Park | G11C 8/08 365/185.19 |
| 2011/0194352 A1 | 8/2011 | Zhao et al. | |

* cited by examiner

*Primary Examiner* — Thong Q Le
(74) *Attorney, Agent, or Firm* — Dicke, Billig & Czaja, PLLC

(57) ABSTRACT

An embodiment of a method of programming might include applying a first voltage difference across a first memory cell to be programmed, where applying the first voltage difference comprises applying a first channel bias voltage to a channel of the first memory cell, and applying a second voltage difference, substantially equal to the first voltage difference, across a second memory cell to be programmed while applying the first voltage difference across the first memory cell, where applying the second voltage difference comprises applying a second channel bias voltage to a channel of the second memory cell. The first channel bias voltage is different than the second channel bias voltage, and the first memory cell and the second memory cell are commonly coupled to an access line and are at different locations along a length of the access line.

30 Claims, 7 Drawing Sheets

APPLYING SUBSTANTIALLY THE SAME VOLTAGE DIFFERENCES ACROSS MEMORY CELLS AT DIFFERENT LOCATIONS ALONG AN ACCESS LINE WHILE PROGRAMMING

FIELD

The present disclosure relates generally to, programming memory cells, and, in particular, the present disclosure relates to applying substantially the same voltage differences across memory cells at different locations along an access line while programming.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cells. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series between a pair of select transistors, e.g., a source select transistor and a drain select transistor. Each source select transistor is connected to a source, while each drain select transistor is connected to a data line, such as column bit line. A "column" may refer to memory cells that are commonly coupled to a local data line, such as a local bit line. It does not require any particular orientation or linear relationship, but instead refers to the logical relationship between memory cell and data line.

Programming typically involves applying a program voltage to one or more selected access lines, e.g., using a driver, such as an access line driver. For example, a driver might be coupled to what may be referred to as the beginning of the access line. When a voltage is applied to an access line, there is typically a voltage delay along the length of an access line due to resistive and capacitive effects (commonly referred to as an RC delay). The RC delay increases with increasing distance from the beginning of the access line. This can cause the memory cells (e.g., target memory cells targeted for programming) along the length of the access line to program at different rates, with the memory cells closest to beginning of access line programming faster than those memory cells further away from the beginning of the access line.

For example, the target memory cells might be programmed by applying a program voltage pulse to the access line and determining whether any target memory cells remain unprogrammed. If any target memory cells remain unprogrammed, the target memory cells that are programmed are inhibited from further programming and a subsequent program voltage pulse, obtained by increasing the preceding program voltage pulse by a voltage step, is applied to the access line, and it is determined whether any target memory cells remain unprogrammed. This might be repeated until a threshold number of target memory cells are programmed, for example.

The memory cells that program more slowly, e.g., due to their increased distance from the beginning of the access line, might require a larger number program voltage pulses, with subsequently increasing voltages, and thus might ultimately determine the number program voltage pulses applied to the access line. The increased number of program voltage pulses, with subsequently increasing voltages, can increase the effects of program disturb on memory cells that are that are closer the beginning of the access line that are already programmed.

For the reasons stated above, and for other reasons stated below which will become apparent to those skilled in the art upon reading and understanding the present specification, there is a need in the art for alternatives to programming memory cells coupled to a given access line.

DETAILED DESCRIPTION

Figure 1:
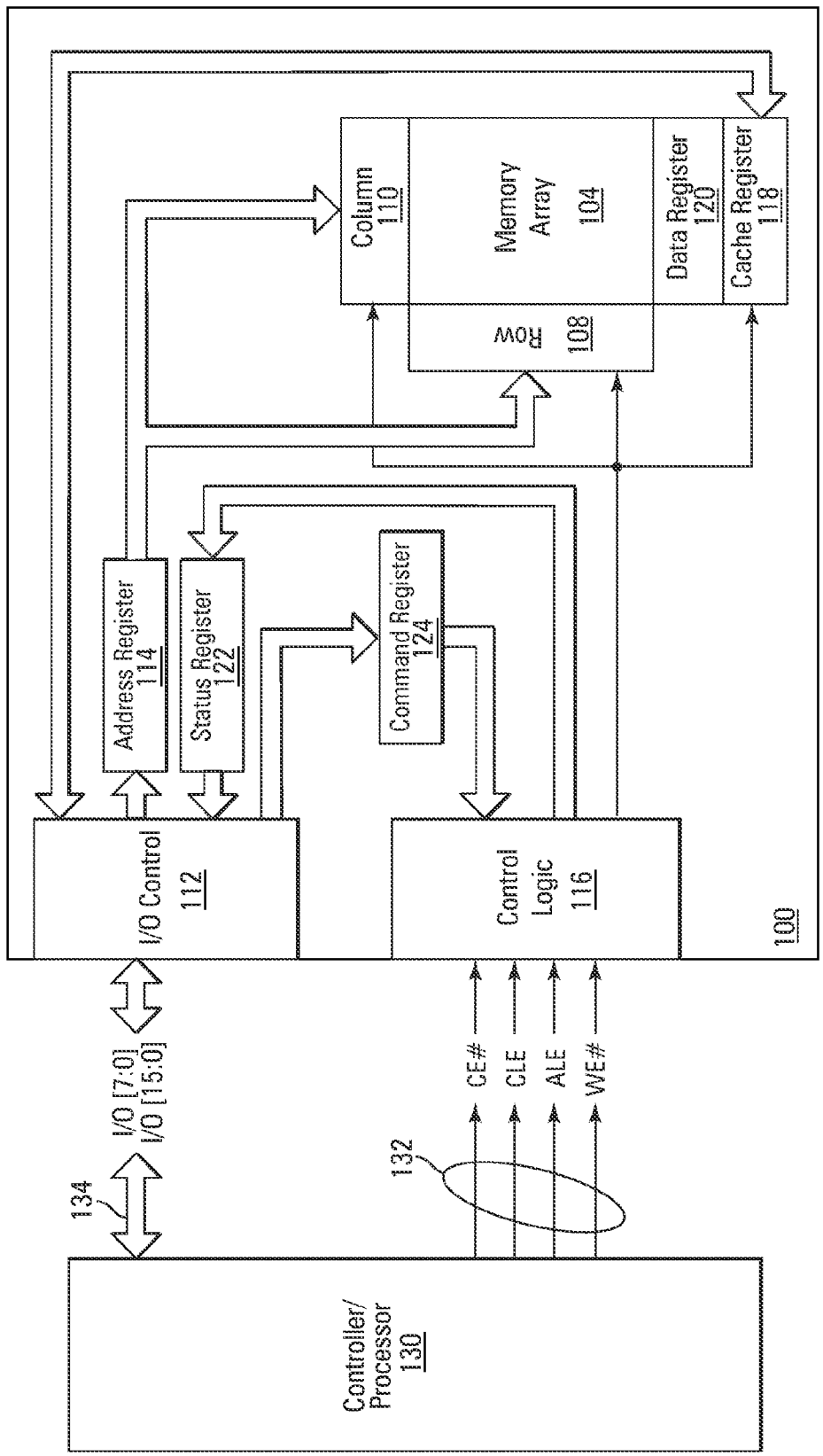
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a simplified block diagram of an electronic device, e.g., an integrated circuit device, such a memory device 100, in communication with a controller 130, such as a memory controller, e.g. a host controller, as part of an electronic system (e.g., a memory system), according to an embodiment. Memory device 100 might be a NAND flash memory device, for example.

Controller 130 might include a processor, for example. Controller 130 might be coupled to a host, for example, and may receive command signals (or commands), address signals (or addresses), and data signals (or data) from the host and may output data to the host.

Memory device 100 includes an array of memory cells 104. A row decoder 108 and a column decoder 110 might be provided to decode address signals. Address signals are received and decoded to access memory array 104.

Memory device 100 may also include input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for controller 130. The control logic 116 is in communication with row decoder 108 and column decoder 110 to control the row decoder 108 and column decoder 110 in response to the addresses.

Control logic 116 can be included in controller 130. Controller 130 can include, other circuitry, firmware, software, or the like, whether alone or in combination. Controller 130 can be an external controller (e.g., in a separate die from the memory array 104, whether wholly or in part) or an internal controller (e.g., included in a same die as the memory array 104).

Controller 130 may be configured to cause memory device 100 or a system, such as the system in FIG. 1 that includes memory device 100, to perform the methods disclosed herein. For example, controller 130 might be configured to cause memory device 100 or the system in FIG. 1 to perform a method of programming, including applying a first voltage difference across a first memory cell to be programmed and applying a second voltage difference, substantially equal to the first voltage difference, across a second memory cell to be programmed while applying the first voltage difference across the first memory cell, where the first memory cell and the second memory cell are commonly coupled to an access line and are at different locations along a length of the access line. For example, control gates of the first and second memory cells commonly coupled to the access line might be at different voltages, at least in part, as a result of a voltage delay in the access line.

In another example, controller 130 might be configured to cause memory device 100 or the system in FIG. 1 to perform a method of programming, including concurrently applying first and second voltage differences respectively across first and second memory cells respectively having control gates commonly coupled to an access line, where the first and second voltage differences respectively cause, at least in part, the first and second memory cells to be programmed at substantially a same speed and where the control gates are at different voltages as a result of a voltage delay in the access line.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to controller 130 and subsequent output to a host; then new data is passed from the data register 120 to the cache register 118. A status register 122 is in communication with I/O control circuitry 112 and control logic 116 to latch the status information for output to the controller 130.

Memory device 100 receives control signals at control logic 116 from controller 130 over a control link 132. The control signals may include at least a chip enable CE#, a command latch enable CLE, an address latch enable ALE, and a write enable WE#.

Memory device 100 receives command signals (which represent commands), address signals (which represent addresses), and data signals (which represent data) from controller 130 over a multiplexed input/output (I/O) bus 134 and outputs data to controller 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
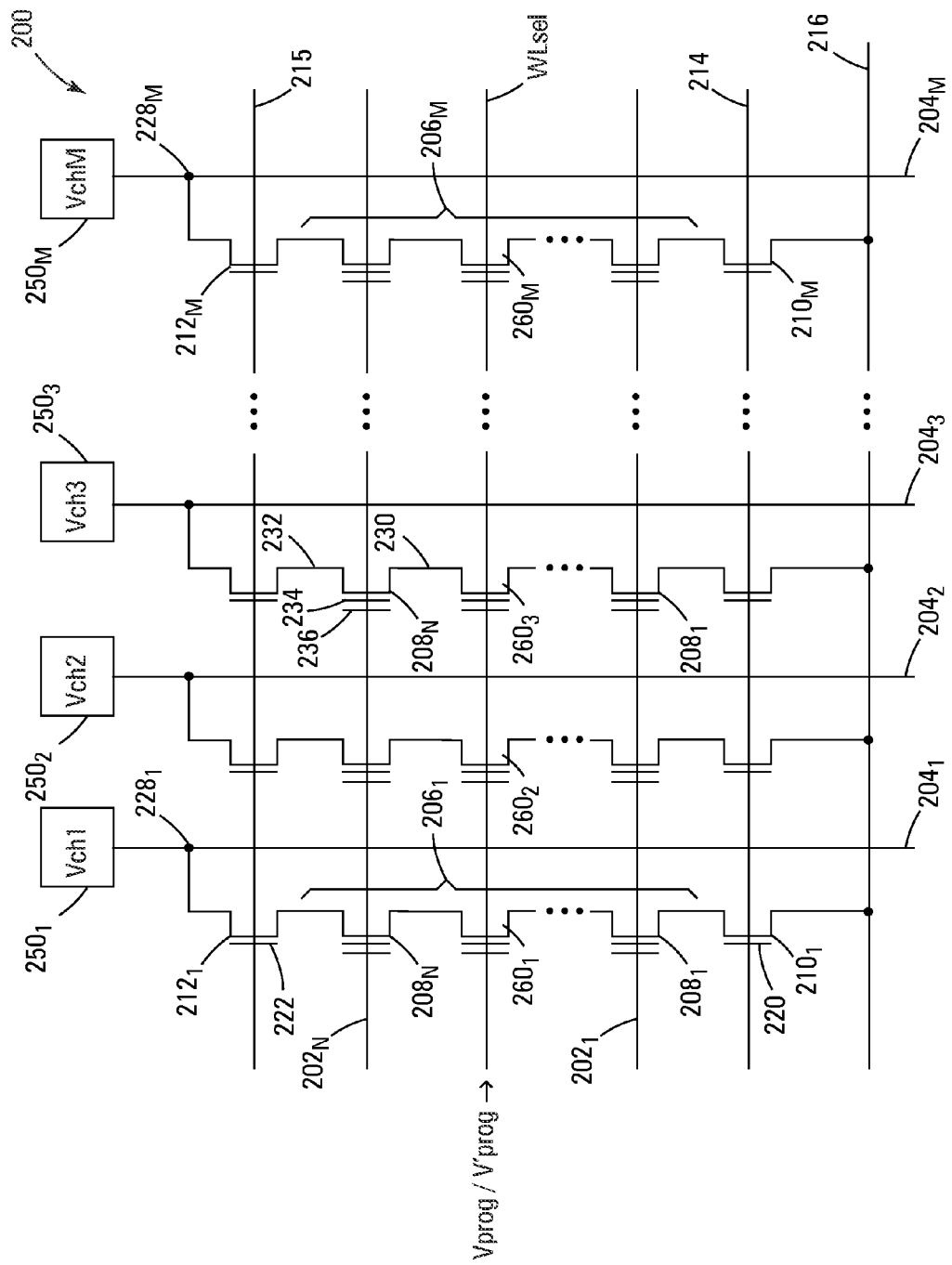
FIG. 2 is a schematic of an example of a memory array.

FIG. 2 is a schematic of a NAND memory array 200, e.g., as a portion of memory array 104. Memory array 200 includes access lines, such as word lines $202_1$ to $202_N$, and data lines, such as bit lines $204_1$ to $204_M$. The bit lines 204 may be coupled to global data lines, such as global bit lines (not shown), in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 might be arranged in rows (each corresponding to a word line 202) and columns (each corresponding to a bit line 204). Each column may include a string of series-coupled memory cells, such as one of NAND strings $206_1$ to $206_M$. Each NAND string 206 might be coupled to a common source 216 and might include memory cells $208_1$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_1$ to $210_M$ (e.g., that may be source select transistors), and a drain select transistor 212 (e.g., a field-effect transistor), such as one of the select transistors $212_1$ to $212_M$ (e.g., that may be drain select transistors). Select transistors $210_1$ to $210_M$ might be commonly coupled to a select line 214, such as a source select line, and select transistors $212_1$ to $212_M$ might be commonly coupled to a select line 215, such as a drain select line.

A source of each select transistor 210 might be connected to common source 216. The drain of each select transistor 210 might be connected to the source of a memory cell $208_1$ of the corresponding NAND string 206. For example, the drain of select transistor $210_1$ might be connected to the source of memory cell $208_1$ of the corresponding NAND string $206_1$. Therefore, each select transistor 210 might be configured to selectively couple a corresponding NAND string 206 to common source 216. A control gate 220 of each source select transistor 210 might be connected to select line 214.

The drain of each select transistor 212 might be connected to the bit line 204 for the corresponding NAND string at a drain contact 228, such as one of the drain contacts $228_1$ to $228_M$. For example, the drain of select transistor $212_1$ might be connected to the bit line $204_1$ for the corresponding NAND string $206_1$ at drain contact $228_1$. The source of each select transistor 212 might be connected to the drain of a memory cell $208_N$ of the corresponding NAND string 206. For example, the source of select transistor $212_1$ might be connected to the drain of memory cell $208_N$ of the corresponding NAND string $206_1$. Therefore, each select transistor 212 might be configured to selectively couple a corresponding NAND string 206 to a corresponding bit line 204. A control gate 222 of each select transistor 212 might be connected to select line 215.

The memory array in FIG. 2 might be a quasi-two-dimensional memory array and semiconductor 225 might have a planar structure, e.g., having an upper surface that lies in substantially a single plane. Alternatively, the memory array in FIG. 2 might be a three-dimensional memory array, where strings $206_1$ and $206_2$, might be adjacent to semiconductor pillars, e.g., individual semiconductor pillars.

Typical construction of memory cells 208 might include a source 230 and a drain 232, a charge-storage structure 234 (e.g., a floating gate, charge trap, etc.) that can store a charge that determines a data value of the memory cell, and a control gate 236, as shown in FIG. 2. Memory cells 208 have their control gates 236 coupled to (and in some cases form a portion of) a word line 202. A column of the memory cells 208 may be a NAND string 206 coupled to a given bit line 204. A row of the memory cells 208 may be those memory cells commonly coupled to a given word line 202.

Rows of memory cells 208 often include every other memory cell 208 commonly coupled to a given word line 202. For example, memory cells 208 commonly coupled to a word line 202 and selectively coupled to even bit lines 204 may be a row of memory cells 208, while memory cells 208 commonly coupled to that word line 202 and selectively coupled to odd bit lines 204 may be another row of memory cells 208. Other groupings of memory cells 208 commonly coupled to a word line 202 may also define a row of memory cells 208. For certain memory devices, all memory cells commonly coupled to a given word line might be deemed a physical row, while those portions of the physical row that are read during a single read operation or programmed during a single program operation (e.g., even or odd memory cells) might be deemed a logical row, sometimes referred to as a page.

Although the examples of FIGS. 1 and 2 are discussed in conjunction with NAND flash, the embodiments described herein are not limited to NAND flash, but can include other flash architectures, such as NOR flash, etc.

Bias circuits $250_1$ to $250_M$ might be respectively coupled to bit lines $204_1$ to $204_M$, one-to-one, for supplying voltages to bit lines $204_1$ to $204_M$. For example, while a program voltage pulse, having a program voltage Vprog/V'prog, is applied to selected word line WLsel in FIG. 2, bias circuits $250_1$ to $250_M$ might respectively apply channel bias voltages Vch1 to VchM respectively to bit lines $204_1$ to $204_M$. That is, for example, while the program voltage Vprog/V'prog is applied to word line WLsel, select transistors $212_1$ to $212_M$ might be activated, allowing channel bias voltages Vch1 to VchM respectively applied to bit lines $204_1$ to $204_M$ to respectively bias channels $260_1$ to $260_M$ of the memory cells coupled to word line WLsel at the channel bias voltages Vch1 to VchM.

Figure 3:
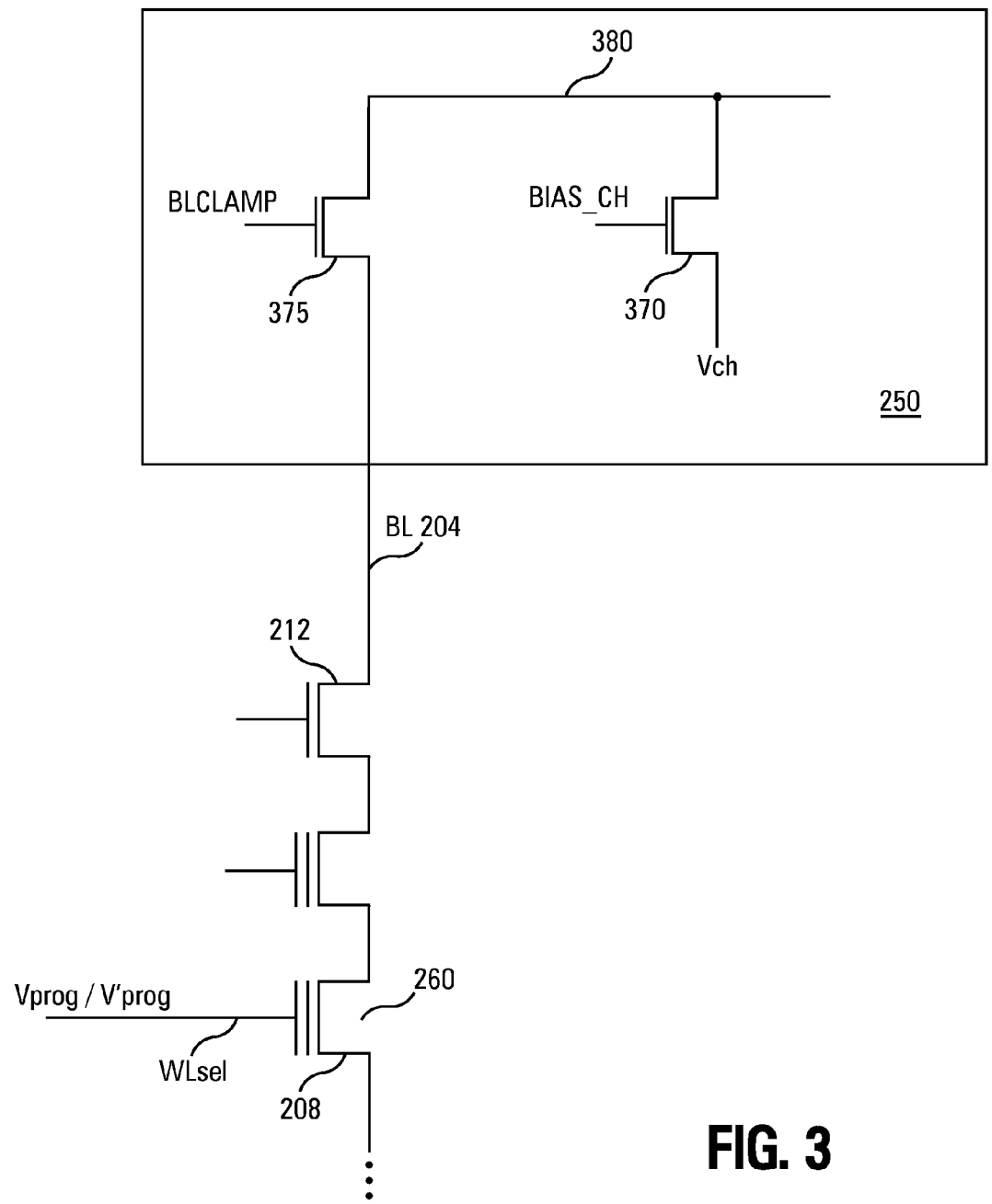
FIG. 3 illustrates an example of a bias circuit.

FIG. 3 illustrates an example of a bias circuit 250 coupled to a bit line 204 that might be coupled to a channel 260 of a memory cell 208 coupled to word line WLsel through an activated select transistor 212. For example, each of the circuits $250_1$ to $250_M$ might be configured as shown in FIG. 3.

A bias circuit 250 might couple a bias voltage Vch to a bit line 204 through activated transistors 370 and 375 of bias circuit 250. Transistor 370 might be activated in response to receiving a control signal BIAS_CH, and transistor 375 might be activated in response to receiving a control signal BLCLAMP. For example, a channel bias voltage Vch might be placed on the line 380 coupled to transistor 375 by activating transistor 370, and the channel bias voltage Vch might be placed on a bit line 204 by activating transistor 375.

In some examples, channel bias voltage Vch might be a single output of a plurality of outputs of a multiplexer, not shown, that can be used to selectively output other channel bias voltages or a program inhibit voltage (e.g., about 2.2 volts to about 2.5 volts). For example a program inhibit voltage might be output to inhibit further programming of a programmed memory cell.

Figure 4:
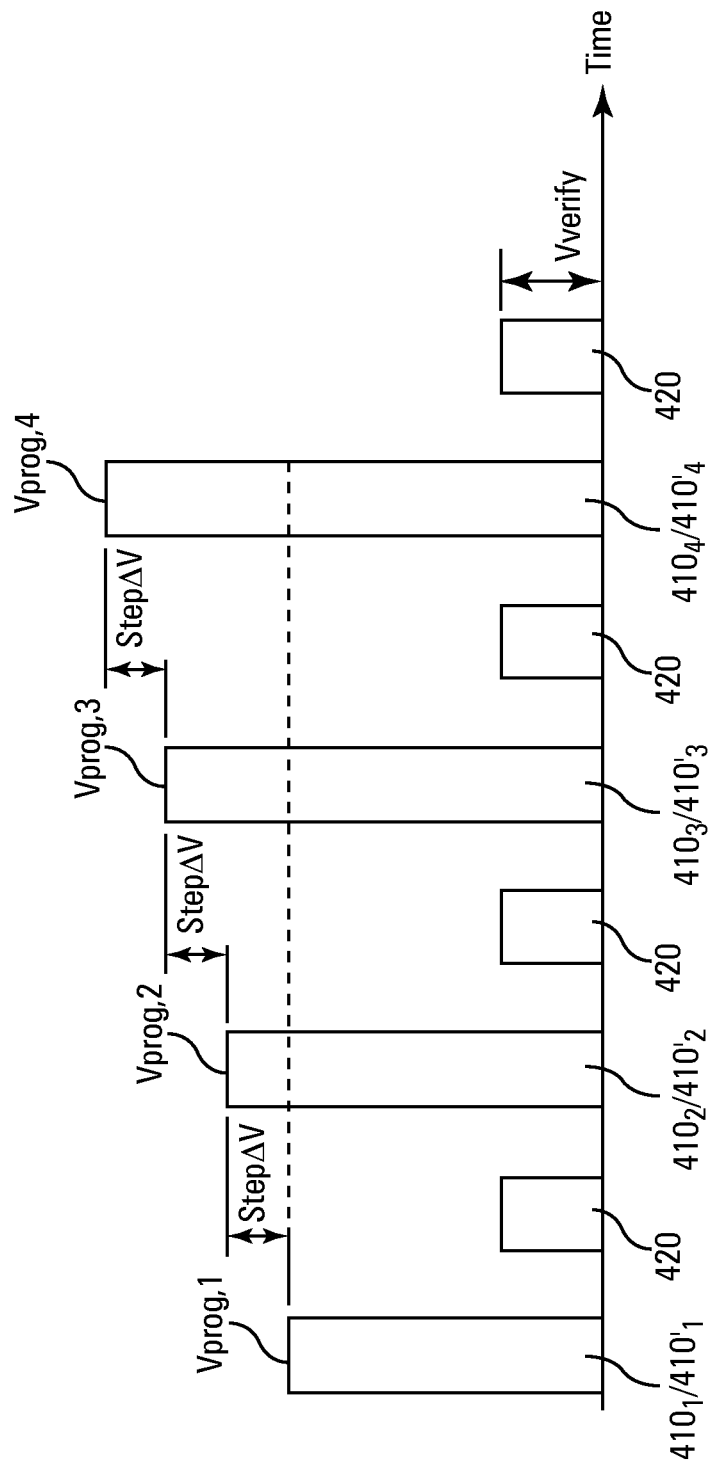
FIG. 4 illustrates an example of a number of program voltage pulses that might be applied to an access line.

FIG. 4 illustrates an example of a number of program voltage pulses 410/410' (e.g., program voltage pulses $410_1$/

$410'_1$ to $410_4/410'_4$) that might be applied to word line WLsel to program memory cells (e.g., target memory cells) targeted for programming that are commonly coupled to word line WLsel. The location (e.g., the point) on word line WLsel at which a program voltage pulse is applied might be referred to as the beginning of word line WLsel. A program-verify operation might be performed after each program voltage pulse 410/410' is applied. The effect of applying a program voltage pulse 410 to word line WLsel is discussed in conjunction with FIGS. 5A-5C, and the effect of applying a program voltage pulse 410' to word line WLsel is discussed in conjunction with FIGS. 6A-6C.

Programming the target memory cells coupled to word line WLsel might include activating the select transistors 212 (FIG. 2). Bias circuits 250 may then apply channel bias voltages to the bit lines respectively coupled, by the activated select transistors 212, to the NAND strings 206 having the respective target memory cells, thereby biasing the channels of the respective target memory cells at their respective channel bias voltages. Any untargeted memory cells coupled to word line WLsel that are not selected for programming might be inhibited from being programmed by applying a program inhibit voltage to the bit lines coupled to those memory cells, and thus the channels of those memory cells. When programming target memory cells respectively coupled to bit lines $204_1$ to $204_M$ by respective ones of the activated select transistors $212_1$ to $212_M$, for example, the channel bias voltages Vch1 to VchM might be respectively applied to bit lines $204_1$ to $204_M$, and thus to channels $260_1$ to $260_M$ (FIG. 2).

With the channels of the target memory cells biased at their respective channel bias voltages and the channels of any memory cells either untargeted for programming or already programmed at the program inhibit voltage, a program voltage pulse, having a program voltage Vprog, may be applied to word line WLsel, as shown in FIGS. 2 and 3. Programming may commence by applying a program voltage pulse $410_1$, having a program voltage Vprog,1, to word line WLsel. A program voltage pulse $410'_1$ might be of shorter duration (e.g., might be narrower in width) than program voltage pulse $410_1$ and might have a greater program voltage than program voltage Vprog, 1, for example. The program-verify operation may then be performed by subsequently applying a program verify voltage pulse 420, having a voltage Vverify, to word line WLsel. If the program verify indicates that one or more of the target memory cells are programmed, the programming is completed for those memory cells, and the program inhibit voltage might be applied to the bit lines 204 coupled to those memory cells, and thus the channels of those memory cells.

If more than a threshold number (which in some cases may be "any") of the target memory cells remain unprogrammed after the program verify, a program voltage pulse $410_2$, having a program voltage Vprog,2, might be applied to word line WLsel, where program voltage Vprog,2 exceeds the program voltage Vprog, 1 by a program step voltage Step$\Delta$V (e.g., about 0.2 volt), e.g., programming voltage Vprog,2=Vprog,1+Step$\Delta$V. For example, the remaining unprogrammed target memory cells may then receive the additional programming voltage pulse $410_2$, having program voltage Vprog,2, while programmed target memory cells and other memory cells associated with word line WLsel may be inhibited from programming.

A program voltage pulse $410'_2$ might be of shorter duration (e.g., might be narrower in width) than program voltage pulse $410_2$ and might have a greater program voltage than program voltage Vprog,2. The program voltage of program voltage pulse $410'_2$ might exceed the program voltage of program voltage pulse $410'_1$ by program step voltage Step$\Delta$V, for example.

If the program verify indicates that one or more of the remaining target memory cells are now programmed, the programming is completed for those memory cells. This sequence may be repeated, e.g., using voltage program voltage pulses $410_3$ and $410_4$ respectively having program voltages Vprog,3 and Vprog,4, until at least a threshold number (which in some cases may be all or a certain percentage of all) of the target memory cells are programmed, i.e., until at least a threshold number of target memory cells are at least at their desired program threshold voltage Vt.

Program voltage pulses $410'_3$ and $410'_4$ might be of respectively shorter duration (e.g., might be respectively narrower in width) than voltage pulses $410_3$ and $410_4$, for example. Program voltage pulses $410'_3$ and $410'_4$ might respectively have program voltages that are respectively greater than program voltages Vprog,3 and Vprog,4. For example, the program voltage of voltage pulse $410'_3$ might exceed the program voltage of voltage pulse $410'_2$ by program step voltage Step$\Delta$V, and the program voltage of voltage pulse $410'_4$ might exceed the program voltage of voltage pulse $410'_3$ by program step voltage Step$\Delta$V.

Figure 5A:
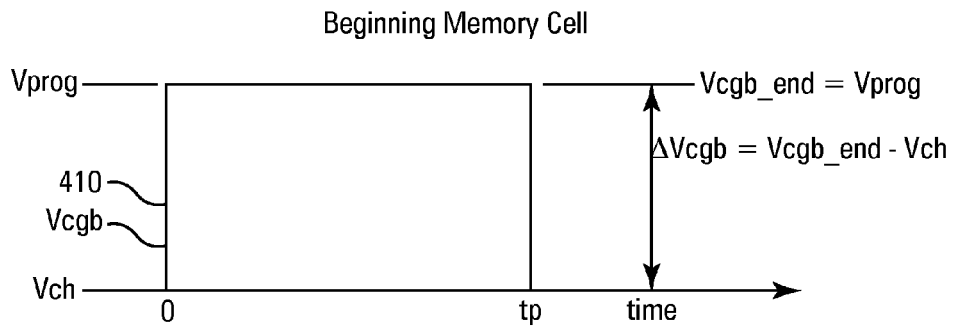
FIG. 5A is a comparison of a program voltage pulse, applied to a beginning of a selected access line, to a voltage received at a control gate of a memory cell close to the beginning of a selected access line.

FIG. 5A is a comparison of a program voltage pulse 410 (e.g., any one of the program voltage pulses $410_1$ to $410_4$ in FIG. 4), applied to the beginning of word line WLsel, to a control gate voltage Vcgb received at a control gate of a target memory cell (e.g., that may be referred to as the beginning memory cell), in response to program voltage pulse 410. The beginning memory cell may be close enough to the beginning of word line WLsel so that the voltage Vcgb and program voltage pulse 410 are coincident. That is, the distance along the length of the word line WLsel between the beginning memory cell and the beginning of the word line WLsel is such that the RC delay of word line WLsel on the voltage Vcgb is negligible, for example. The voltage Vcgb_end on the control gate of the beginning memory cell at the end of program voltage pulse 410 might be equal to the program voltage Vprog of program voltage pulse 410, for example. The beginning memory cell, for example, might be adjacent to the very beginning of word line WLsel, e.g., the beginning memory cell might be in string $206_1$ in FIG. 2.

Note that the program voltage pulse 410 might have a width of time tp, e.g., the amount of time that has elapsed since the beginning of program voltage pulse 410 at time zero. A program verify might be performed after program voltage pulse 410 is removed from word line WLsel. For example, a program verify voltage pulse 420 (FIG. 4) might be applied to word line WLsel after program voltage pulse 410 is removed from word line WLsel.

The voltage difference $\Delta$Vcg between the voltage on the control gate of a memory cell at the end of program voltage pulse 410, e.g., at time tp, and a channel bias voltage Vch on the channel of the memory cell might, at least in part, determine the program speed of the memory cell, and thus the number of program voltage pulses it might take to program the memory cell. That is, the voltage difference $\Delta$Vcg across a memory cell at the end of the program voltage pulse might, at least in part, determine the amount of increase in the Vt of the memory cell, for example. For example, $\Delta$Vcg=Vcg_end−Vch, where Vcg_end is the voltage on the control gate of a memory cell at the end of the program voltage pulse.

The program speed of a memory cell, and thus the number of program pulses it takes to program the memory cell, for example, may depend, at least in part, on the voltage difference ΔVfg between the voltage on a charge-storage structure, such as a floating gate, of a memory cell at the end of the program voltage pulse and the channel bias voltage Vch on the channel of the memory cell. For example, ΔVfg=RVcg_end−Vch, where R is the coupling ratio between the control gate and the charge-storage structure for the memory cell and the product RVcg_end is the voltage on the charge-storage structure of the memory cell at the end of the program voltage pulse. It can be shown that ΔVfg=RΔVcg−Vch(1−R). This means that for a given memory cell (e.g. constant coupling ratio R) and a fixed channel voltage Vch, the voltage difference ΔVfg varies linearly with the voltage difference ΔVcg. This means that the program speed of a memory cell, and thus the number of program pulses it takes to program the memory cell, depends, at least in part, of the voltage difference ΔVcg between the control gate voltage on the control gate at the end of the program voltage pulse and the channel bias voltage. Therefore, as used herein, the voltage difference between the control gate voltage and the channel bias voltage may include the voltage difference between the charge-storage structure voltage and the channel bias voltage.

For the beginning memory cell, for example, the voltage difference ΔVcgb, e.g., across the beginning memory cell, between the voltage Vcgb_end on the control gate of the beginning memory cell at the end of program voltage pulse 410 and channel bias voltage Vch on the channel of the beginning memory cell, e.g., ΔVcgb=Vcgb_end−Vch, might determine, at least in part, the program speed, and thus the increase in the Vt, of the beginning memory cell. For example, the voltage difference ΔVcgb across the beginning memory cell at the end of the program voltage pulse might, at least in part, determine the number of program voltage pulses it takes to program the beginning memory cell.

The voltage difference ΔVcgb might be selected to reduce the number of program voltage pulses that might be required to program a memory cell. For example, the program voltage pulse 410 in FIG. 5A might be an initial program voltage pulse, such as the program voltage pulse $410_1$ in FIG. 4, and might be selected so that the resulting voltage difference ΔVcgb might be an initial voltage difference that increases the Vt of a memory cell so that it is at least close to the program Vt of the memory cell.

Figure 5B:
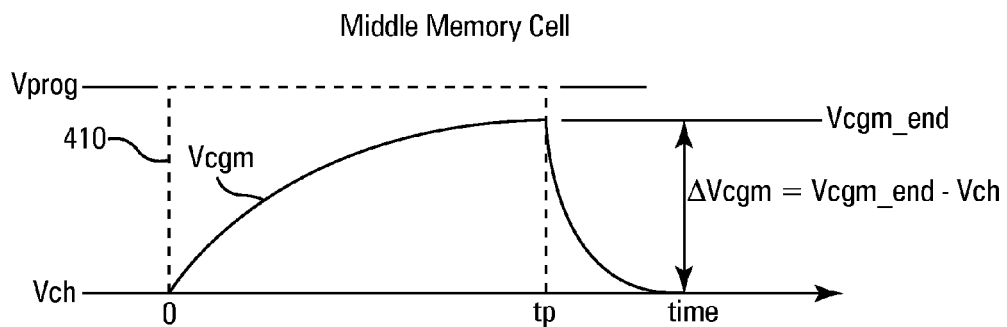
FIG. 5B is a comparison of a program voltage pulse, applied to a beginning of a selected access line, to a voltage received at a control gate of a memory cell close to a middle of a selected access line.

FIG. 5B is a comparison of the program voltage pulse 410, applied to the beginning of word line WLsel, to a control gate voltage Vcgm received at a control gate of a target memory cell that is close to the middle of word line WLsel (e.g., that may be referred to as the middle memory cell), in response to program voltage pulse 410. The distance along the length of the word line WLsel between the middle memory cell and the beginning of the word line WLsel is such that the voltage Vcgm is delayed relative to the program voltage pulse 410, and thus the voltage Vcgb on the control gate of the beginning memory cell, as a result the RC delay of word line WLsel at the location of the middle memory cell, for example. That is, for example, the voltage Vcgm_end on the control gate of the middle memory cell at the end of program voltage pulse 410 might be less than the program voltage Vprog of program voltage pulse 410, and thus the voltage Vcgb_end on the control gate of the beginning memory cell, at the end of program voltage pulse 410. For example, the difference between the voltage Vcgb_end and the voltage Vcgm_end might, at least in part, be due to the RC voltage delay in word line WLsel between the beginning and middle memory cells. The difference between the program voltage Vprog and the voltage Vcgm_end might, at least in part, be due to the RC voltage delay in word line WLsel between the beginning of word line WLsel where program voltage pulse 410 is applied and the middle memory cell, for example.

The voltage difference ΔVcgm, e.g., across the middle memory cell, between the voltage Vcgm_end at the end of program voltage pulse 410 and channel bias voltage Vch on the channel of the middle memory cell is ΔVcgm=Vcgm_end−Vch, where the channel bias voltage Vch on the channel of the middle memory cell might be the same as the channel bias voltage Vch on the channel of the beginning memory cell and might be zero volts, for example. Note that the voltage difference ΔVcgm across the middle memory cell at the end of the program voltage pulse 410 might be less than the voltage difference ΔVcgb across the beginning memory cell at the end of the program voltage pulse 410. This means that the middle memory cell might program slower than the beginning memory cell. For example, the Vt of the middle memory cell might be increased by a lesser amount in response to the program voltage pulse 410 than the beginning memory cell, for example. As a result, more program voltage pulses might be required to program the middle memory cell than the beginning memory cell, for example.

In an example, the beginning memory cell might be inhibited while additional program voltage pulses with sequentially increasing program voltages are applied to word line WLsel to program the middle memory cell. The one or more additional program voltage pulses might act to program disturb the inhibited beginning memory cell, for example.

In some examples, the voltage difference ΔVcgm across the middle memory cell at the end of the program voltage pulse 410 might be about 0.8 volt to about 1 volt less than the voltage difference ΔVcgb across the beginning memory cell at the end of the program voltage pulse 410. For example, for a program step voltage StepΔV of about 0.2 volt, about four to about five more program voltage pulses 410 might be required to program the middle memory cell than the beginning memory cell.

Figure 5C:
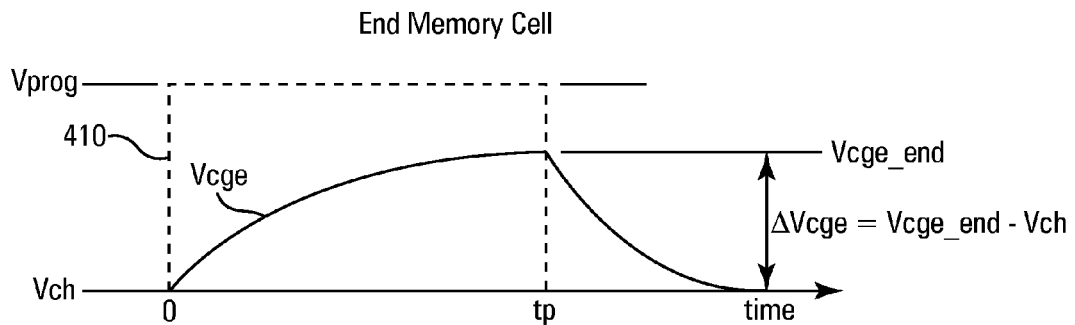
FIG. 5C is a comparison of a program voltage pulse, applied to a beginning of a selected access line, to a voltage received at a control gate of a memory cell close to an end of a selected access line distally from the beginning of the selected access line.

FIG. 5C is a comparison of the program voltage pulse 410, applied to the beginning of word line WLsel, to a control gate voltage Vcge received at a control gate of a target memory cell that is close to the end of word line WLsel (e.g., that may be referred to as the end memory cell), in response to program voltage pulse 410. The end memory cell, for example, might be adjacent to the very end of word line WLsel, opposite (e.g., distally from) the beginning of word line WLsel, e.g., the end memory cell might be in string $206_M$ in FIG. 2. The middle memory cell might be midway between the beginning and end memory cells, for example.

The distance along the length of the word line WLsel between the end memory cell and the beginning of the word line WLsel is such that the voltage Vcge is delayed relative to the program voltage pulse 410, and thus the voltage Vcgb on the control gate of the beginning memory cell and the voltage Vcgm on the control gate of the middle memory cell, as a result of the RC delay of word line WLsel at the location of the end memory cell, for example. That is, for example, the voltage Vcge_end on the control gate of the end memory cell at the end of program voltage pulse 410 might be less than the program voltage Vprog of program voltage pulse 410, and thus the voltage Vcgb_end on the control gate of the beginning memory cell and the voltage Vcgm_end on the control gate of the middle memory cell at the end of program voltage pulse 410. For example, the difference between the voltage Vcgm_end and the voltage Vcge_end might, at least in part, be due to the RC voltage delay in word line WLsel between the middle and end memory cells. The difference between the program voltage Vprog and the voltage Vcge_end might, at least in part, be due to the RC voltage delay in word line WLsel between the beginning of word line WLsel where program voltage pulse 410 is applied and the end memory cell, for example.

The voltage difference ΔVcge, e.g., across the end memory cell, between the voltage Vcge_end at the end of program voltage pulse 410 and channel bias voltage Vch on the channel of the end memory cell is ΔVcge=Vcge_end−Vch, where the channel bias voltage Vch on the channel of the end memory cell might be the same as the channel bias voltage Vch on the channels of the beginning and middle memory cells and might be zero volts, for example. Note that the voltage difference ΔVcge across the end memory cell at the end of the program voltage pulse 410 might be less than the voltage difference ΔVcgb across the beginning memory cell and the voltage difference ΔVcgm across the middle memory cell at the end of the program voltage pulse 410. This means that the end memory cell might program slower than the beginning and middle memory cells. For example, the Vt of the end memory cell might be increased by a lesser amount in response to the program voltage pulse 410 than the beginning memory cell and the middle memory cell, for example. As a result, more program voltage pulses might be required to program the end memory cell than either the beginning memory cell or the middle memory cell, for example.

In some examples, the voltage difference ΔVcge across the end memory cell at the end of the program voltage pulse 410 might be about 1.5 to about 2 volts less than the voltage difference ΔVcgb across the beginning memory cell at the end of the program voltage pulse 410. For example, for a program step voltage StepΔV of about 0.2 volt, about seven to about ten more program voltage pulses 410 might be required to program the end memory cell than the beginning memory cell.

In an example, the beginning and middle memory cells might be inhibited while additional program voltage pulses with sequentially increasing program voltages are applied to word line WLsel to program the end memory cell. The one or more additional program voltage pulses might act to program disturb the inhibited middle and beginning memory cells, for example. In examples where additional program voltage pulses might be required to program the middle memory cell while the beginning memory cell is inhibited, additional program voltage pulses that might be applied to program the end memory cell while the middle cell is inhibited may be in addition to those additional program voltage pulses might be required to program the middle memory cell, therefore acting to compound the program disturb to the beginning memory cell.

Figure 6A:
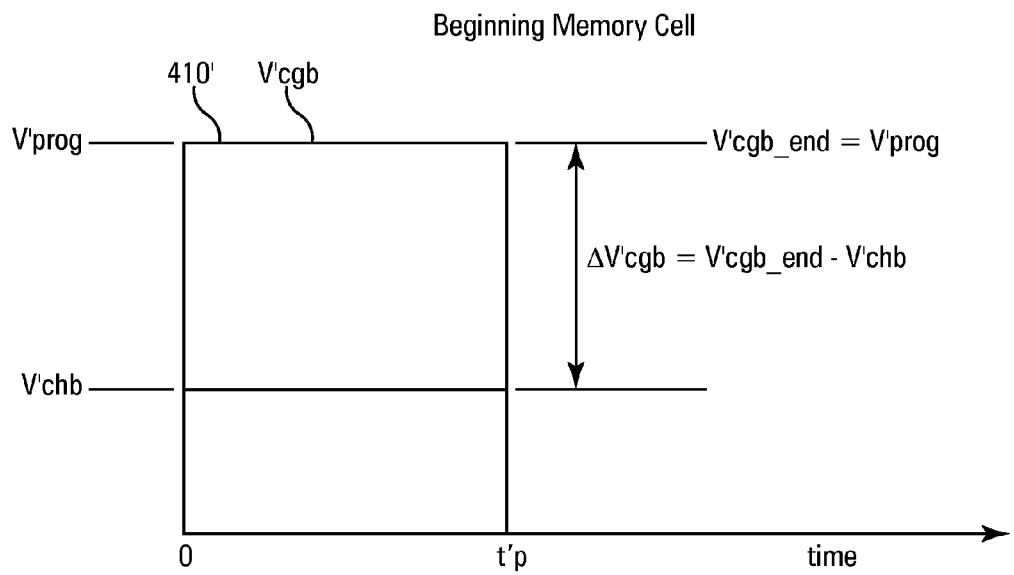
FIG. 6A is a comparison of a program voltage pulse, applied to a beginning of a selected access line, to a voltage received at a control gate of a memory cell close to the beginning of a selected access line.

FIG. 6A is a comparison of a program voltage pulse 410' (e.g., any one of the program voltage pulses 410'$_1$ to 410'$_4$ in FIG. 4), applied to the beginning of word line WLsel, to a control gate voltage V'cgb received at the control gate of the beginning memory cell (e.g., discussed above in conjunction with FIG. 5A), in response to program voltage pulse 410'. The program voltage pulse 410' in FIG. 6A may be applied to word line WLsel instead of the program voltage pulse 410 in FIG. 5A.

Program voltage pulse 410' might have a program voltage V'prog that might be greater than (e.g., about 2 volts greater than) the program voltage Vprog of program voltage pulse 410 in FIG. 5A. Program voltage pulse 410' might have a width of time t'p, e.g., the amount of time that has elapsed since the beginning of program voltage pulse 410' at time zero. For some embodiments, the width of program voltage pulse 410' in FIG. 6A might be less than the width of program voltage pulse 410 in FIG. 5A, meaning that the time t'p in FIG. 6A might be less that the time tp in FIG. 5A. Alternatively, the width of program voltage pulse 410' in FIG. 6A might be equal to the width of program voltage pulse 410 in FIG. 5A.

A program verify might be performed after program voltage pulse 410' is removed from word line WLsel. For example, a program verify voltage pulse 420 (FIG. 3) might be applied to word line WLsel after program voltage pulse 410' is removed from word line WLsel.

Note that the voltage V'cgb might be coincident with program voltage pulse 410', and the voltage V'cgb_end on the control gate of the beginning memory cell at the end of program voltage pulse 410' might be equal to program voltage V'prog. This is due to the fact that the RC delay at the beginning memory cell might be negligible, as discussed above in conjunction with FIG. 5A.

The channel of the beginning memory cell might be biased, e.g., using a bias circuit 250 (FIG. 3), at a channel bias voltage V'chb (e.g., about 1.6 volts to about 2 volts) while program voltage pulse 410' is being applied to word line WLsel. For example, the voltage difference ΔV'cgb, e.g., across the beginning memory cell, between the voltage V'cgb_end at the end of program voltage pulse 410' and channel bias voltage V'chb on the channel of the beginning memory cell, e.g., ΔV'cgb=V'cgb_end−V'chb, might determine, at least in part, the program speed, and thus the increase in the Vt, of the beginning memory cell.

Figure 6B:
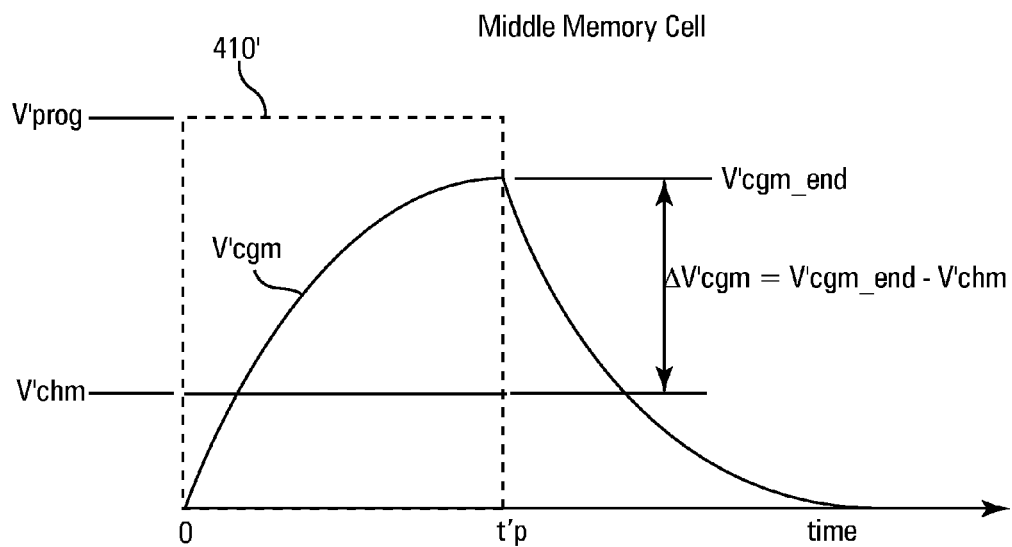
FIG. 6B is a comparison of a program voltage pulse, applied to a beginning of a selected access line, to a voltage received at a control gate of a memory cell close to a middle of a selected access line.

FIG. 6B is a comparison of the program voltage pulse 410', applied to the beginning of word line WLsel, to a control gate voltage V'cgm received at the control gate of the middle memory cell (e.g., discussed above in conjunction with FIG. 5B), in response to program voltage pulse 410'. Note that the voltage V'cgm is delayed relative to the program voltage pulse 410', and thus the voltage V'cgb on the control gate of the beginning memory cell, as a result the RC delay of word line WLsel at the location of the middle memory cell, for example.

The voltage V'cgm_end on the control gate of the middle memory cell at the end of program voltage pulse 410' might be less than the program voltage V'prog of program voltage pulse 410', and thus the voltage V'cgb_end on the control gate of the beginning memory cell at the end of program voltage pulse 410. For example, the difference between the voltage V'cgb_end and the voltage V'cgm_end might, at least in part, be due to the RC voltage delay in word line WLsel between the beginning and middle memory cells. The difference between the program voltage V'prog and the voltage V'cgm_end might, at least in part, be due to the RC voltage delay in word line WLsel between the beginning of word line WLsel where program voltage pulse 410' is applied and the middle memory cell, for example.

The channel of the middle memory cell might be biased, e.g., using a bias circuit 250 (FIG. 3), at a channel bias voltage V'chm (e.g., about 0.8 volt to about 1 volt) while program voltage pulse 410' is being applied to word line WLsel. For example, the voltage difference ΔV'cgm, e.g., across the middle memory cell, between the voltage V'cgm_end at the end of program voltage pulse 410' and channel bias voltage V'chm on the channel of the middle memory cell, e.g., ΔV'cgm=V'cgm_end−V'chm, might determine, at least in part, the program speed, and thus the increase in the Vt, of the middle memory cell.

For some embodiments, the channel bias voltage V'chm on the channel of the middle memory cell might be less than the channel bias voltage V'chb on the channel of the beginning memory cell. For example, in the examples of FIGS. 6A and 6B, the channel bias voltages V'chb and V'chm might be such that the voltage difference ΔV'cgb across the beginning memory cell and the voltage difference ΔV'cgm across the middle memory cell might be substantially equal, so that the programming speeds of the beginning and middle memory cells are substantially equal, for example. That is, for example, channel bias voltage V'chb might exceed channel bias voltage V'chm by a voltage that is substantially equal to the voltage by which the voltage V'cgb_end on the control gate of the beginning memory cell exceeds the voltage V'cgm_end on the control gate of the middle memory cell.

For example, the difference between the programming speeds of the beginning and middle memory cells for the programming conditions of FIGS. 6A and 6B might be small (e.g., negligible) compared to the difference between the programming speeds of the beginning and middle memory cells for the programming conditions of FIGS. 5A and 5B. For example, substantially the same number of program voltage pulses (e.g., to within ±1 program voltage pulse for a step voltage of about 0.2 volt) might program the beginning and middle memory cells for the programming conditions of FIGS. 6A and 6B, thereby reducing the program disturb to the beginning memory cell for the programming conditions of FIGS. 6A and 6B relative to the program disturb to the beginning memory cell for the programming conditions of FIGS. 5A and 5B.

For example, the voltage difference $\Delta V'cgm$ across the middle memory cell at the end of the program voltage pulse 410' might be substantially equal to (e.g., to within about ±0.2 volt of) the voltage difference $\Delta V'cgb$ across the beginning memory cell at the end of the program voltage pulse 410'. That is, for example, the voltage difference $\Delta V'cgm$ across the middle memory cell at the end of the program voltage pulse 410' and the voltage difference $\Delta V'cgb$ across the beginning memory cell at the end of the program voltage pulse 410' might be such that the middle and beginning memory cells program at substantially the same speed.

For example, for a program step voltage Step$\Delta V$ of about 0.2 volt, the program voltage pulses that might be needed to program the beginning and middle memory cells might be within ±1 program voltage pulse of each other. For example, the voltage difference $\Delta V'cgm$ across the middle memory cell at the end of the program voltage pulse 410' might be substantially equal to the voltage difference $\Delta V'cgb$ across the beginning memory cell at the end of the program voltage pulse 410' when the middle and beginning memory cells program at substantially the same speed, e.g., the number of program voltage pulses that program the middle and beginning memory cells are within ±1 program voltage pulses of each other for a step voltage Step$\Delta V$ of about 0.2 volt. The voltage differences $\Delta V'cgm$ and $\Delta V'cgb$ being substantially equal might, at least in part, cause the middle and beginning memory cells to program at substantially the same speed, for example.

Figure 6C:
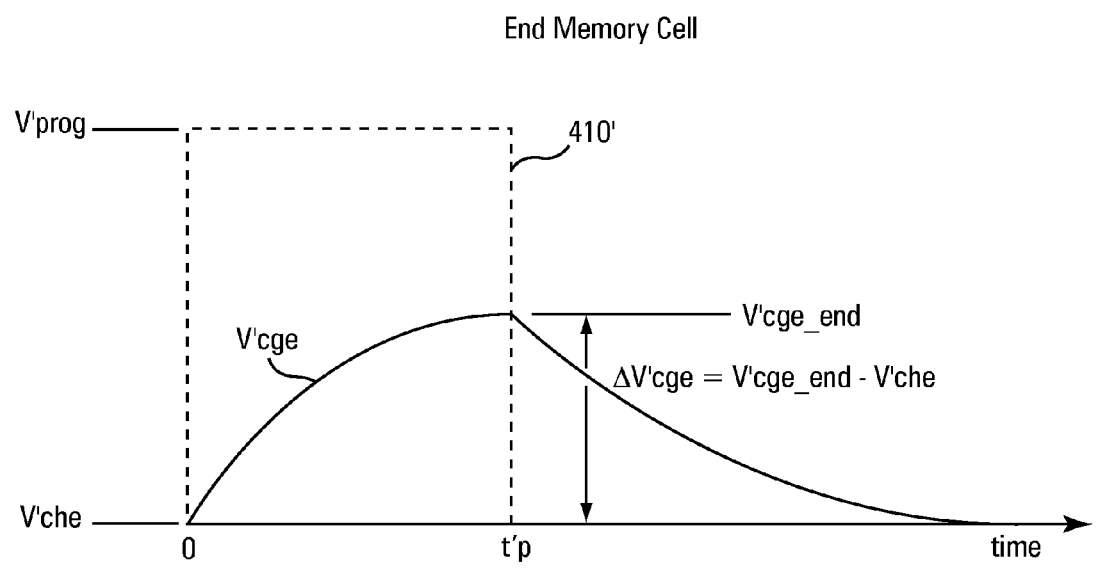
FIG. 6C is a comparison of a program voltage pulse, applied to a beginning of a selected access line, to a voltage received at a control gate of a memory cell close to an end of a selected access line distally from the beginning of the selected access line.

FIG. 6C is a comparison of the program voltage pulse 410', applied to the beginning of word line WLsel, to a control gate voltage V'cge received at the control gate of the end memory cell (e.g., discussed above in conjunction with FIG. 5C), in response to program voltage pulse 410'. Note that the voltage V'cge is delayed relative to the program voltage pulse 410', and thus the voltage V'cgb on the control gate of the beginning memory cell and the voltage V'cgm on the control gate of the middle memory cell, as a result the RC delay of word line WLsel at the location of the end memory cell, for example.

The voltage V'cge_end on the control gate of the end memory cell at the end of program voltage pulse 410' might be less than the program voltage V'prog of program voltage pulse 410', and thus the voltage V'cgb_end on the control gate of the beginning memory cell at the end of program voltage pulse 410' and the voltage V'cgm_end on the control gate of the middle memory cell at the end of program voltage pulse 410'. For example, the difference between the voltage V'cgm_end and the voltage V'cge_end might, at least in part, be due to the RC voltage delay in word line WLsel between the middle and end memory cells. The difference between the program voltage V'prog and the voltage V'cge_end might, at least in part, be due to the RC voltage delay in word line WLsel between the beginning of word line WLsel where program voltage pulse 410' is applied and the end memory cell, for example.

The channel of the end memory cell might be biased, e.g., using a bias circuit 250 (FIG. 3), at a channel bias voltage V'che (e.g., about zero volts) while program voltage pulse 410' is being applied to word line WLsel. For example, the voltage difference $\Delta V'cge$, e.g., across the end memory cell, between the voltage V'cge_end at the end of program voltage pulse 410' and the channel bias voltage V'che on the channel of the end memory cell, e.g., $\Delta V'cge=V'cge\_end-V'che$, might determine, at least in part, the program speed, and thus the increase in the Vt, of the end memory cell.

For some embodiments, the channel bias voltage V'che on the channel of the end memory cell might be less than the channel bias voltage V'chm on the channel of the middle memory cell and the channel bias voltage V'chb on the channel of the beginning memory cell. For example, in the examples of FIGS. 6A-6C, the channel bias voltages V'chb, V'chm, and V'che might be such that the voltage difference $\Delta V'cgb$ across the beginning memory cell, the voltage difference $\Delta V'cgm$ across the middle memory cell, and the voltage difference $\Delta V'cge$ across the end memory cell might be substantially equal (e.g., within about ±0.2 volt of each other), so that the programming speeds of the beginning, middle, and end memory cells are substantially the same, for example. That is, for example, channel bias voltage V'chb might exceed channel bias voltage V'che by a voltage that is substantially equal to the voltage by which the voltage V'cgb_end on the control gate of the beginning memory cell exceeds the voltage V'cge_end on the control gate of the end memory cell, and channel bias voltage V'chm might exceed channel bias voltage V'che by a voltage that is substantially equal to the voltage by which the voltage V'cgm_end on the control gate of the middle memory cell exceeds the voltage V'cge_end on the control gate of the end memory cell.

In some embodiments, for example, the channel bias voltages V'chb, V'chm, and V'che might be determined empirically respectively for the beginning, middle, and end memory cells for a particular program voltage V'prog of program voltage pulse 410' to give voltage differences $\Delta V'cgb$, $\Delta V'cgm$, and $\Delta V'cge$, respectively across the beginning, middle, and end memory cells, that might be substantially equal to each other. That is, for example, the channel bias voltages V'chb, V'chm, and V'che might be determined empirically respectively for the beginning, middle, and end memory cells for a particular program voltage V'prog of program voltage pulse 410' so that the beginning, middle, and end memory cells program at substantially the same speed (e.g., to within ±1 program voltage pulse for a step voltage Step$\Delta V$ of about 0.2 volt).

For example, the difference between the programming speeds of the beginning, middle, and end memory cells for the programming conditions of FIGS. 6A-6C might be small (e.g., negligible) compared to the difference between the programming speeds of the beginning, middle, and end memory cells for the programming conditions of FIGS. 5A-5C. That is, for example, the voltage differences $\Delta V'cgb$, $\Delta V'cgm$, and $\Delta V'cge$, respectively across the beginning, middle, and end memory cells might be such that the beginning, middle and end memory cells program at substantially the same speed.

For example, substantially the same number of program voltage pulses (e.g., to within ±1 program voltage pulses for a step voltage of about 0.2 volt) might program the beginning, middle, and end memory cells for the programming conditions of FIGS. 6A-6C, thereby reducing the program disturb to the beginning and middle memory cells for the programming conditions of FIGS. 6A-6C relative to the program disturb to the beginning and middle memory cells for the programming conditions of FIGS. 5A-5C. The voltage differences $\Delta V'cgb$, $\Delta V'cgm$, and $\Delta V'cge$ being substantially equal might, at least in part, cause the beginning, middle, and end memory cells to program at substantially the same speed, for example.

Note that the voltage differences $\Delta V'cgb$, $\Delta V'cgm$, and $\Delta V'cge$ respectively across the beginning, middle, and end memory cells occur concurrently, e.g., at the time t'p at the end of the program pulse 410'. That is, the voltages V'cgb_end, V'cgm_end, and V'cge_end are respectively on the control gates of the beginning, middle, and end memory cells concurrently, e.g., at the time t'p at the end of the program pulse 410', while the channel bias voltages V'chb, V'chm, and V'che are respectively concurrently applied to the channels of the beginning, middle, and end memory cells. As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time.

The program voltage V'prog of program voltage pulse 410' might be selected so that the voltage V'cge_end on the control gate of the end memory cell at the end of program voltage pulse 410' is substantially equal to the program voltage Vprog of program voltage pulse 410 in FIGS. 5A-5C. The channel bias voltage V'che (e.g., that might be zero volts) on the channel of the end memory cell might be selected to be substantially equal to the channel voltage Vch on the channels of the beginning, middle, and end memory cells for the programming conditions of FIGS. 5A-5C. For example, the voltage difference $\Delta V'cge$ across the end memory cell for the programming conditions of FIG. 6C might be substantially equal to the voltage difference $\Delta Vcgb$ across the beginning memory cell for the programming conditions of FIG. 5A.

As indicated above in conjunction with FIG. 5A, the voltage difference $\Delta Vcgb$ might be an initial voltage difference that increases the Vt of a memory cell so that it is at least close to the program Vt of the memory cell, so as to reduce the number of program voltage pulses that might be required to program the memory cell. Therefore, the substantially equal voltage differences $\Delta V'cgb$, $\Delta V'cgm$, and $\Delta V'cge$ resulting from a program voltage pulse 410' initially applied to word line WLsel might be such that they increase the Vts of the beginning, middle, and end memory cells, to which they are respectively applied, so that the Vts of the beginning, middle, and end memory cells are at least close to the program Vts of the beginning, middle, and end memory cells, so as to reduce the number of program voltage pulses that might be required to program the beginning, middle, and end memory cells.

For some embodiments, while program voltage pulse 410' is applied to word line WLsel, about one third (e.g., about a beginning third) of the target memory cells coupled to word line WLsel closest to the beginning of word line WLsel might have their channels biased at the channel bias voltage V'chb, another third (e.g., about an end third) of the target memory cells coupled to word line WLsel closest to the end of word line WLsel might have their channels biased at the channel bias voltage V'che, and yet another third (e.g., about a middle third) of the target memory cells coupled to word line WLsel between the beginning third and the end third of target memory cells might have their channels biased at the channel bias voltage V'chm. For example, the beginning third of the memory cells might include the beginning memory cell discussed in conjunction with FIG. 6A; the middle third of the memory cells might include the middle memory cell discussed in conjunction with FIG. 6B; and the end third of the memory cells might include the end memory cell discussed in conjunction with FIG. 6C.

For example, substantially equal voltage differences might be applied to a memory cell (e.g., at least one memory cell) from the beginning third, a memory cell (e.g., at least one memory cell) from middle third, and a memory cell (e.g., at least one memory cell) from the end third of the target memory cells coupled to word line WLsel. The channels of any untargeted memory cells coupled to word line WLsel might be biased at the program inhibit voltage, while program voltage pulse 410' is applied to word line WLsel, for example.

For some embodiments, while program voltage pulse 410' is applied to word line WLsel, the channels of respective ones of the target memory cells coupled to word line WLsel to be programmed might be respectively biased so that the difference between the control gate voltage and the channel bias voltage for each of the respective ones the target memory cells is substantially equal to the difference between the control gate voltage and the channel voltage for the remainder of the target memory cells. That is, the voltage difference applied across each of the target memory cells coupled to word line WLsel to be programmed might be substantially equal to (e.g., to within ±0.2 volt of) the voltage difference applied across the remainder of the target memory cells coupled to word line WLsel to be programmed, for example. That is, for example, each of the target memory cells coupled to word line WLsel might program at substantially the same speed (e.g., to within ±1 program voltage pulses for a step voltage of about 0.2 volt).

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:
1. A method of programming, comprising:
applying a first voltage difference across a first memory cell to be programmed during a particular programming operation, wherein applying the first voltage difference comprises applying a first channel bias voltage to a channel of the first memory cell; and
applying a second voltage difference, substantially equal to the first voltage difference, across a second memory cell to be programmed during the particular programming operation while applying the first voltage difference across the first memory cell, wherein applying the second voltage difference comprises applying a second channel bias voltage to a channel of the second memory cell;

wherein the first channel bias voltage is different than the second channel bias voltage; and wherein the first memory cell and the second memory cell are commonly coupled to an access line and are at different locations along a length of the access line.

2. The method of claim 1, wherein the first voltage difference comprises a voltage difference between a first control gate voltage on a control gate of the first memory cell and the first channel bias voltage, and wherein the second voltage difference comprises a voltage difference between a second control gate voltage on a control gate of the second memory cell and the second channel bias voltage.

3. A method of programming, comprising:

applying a first voltage difference across a first memory cell to be programmed, wherein applying the first voltage difference comprises applying a first channel bias voltage to a channel of the first memory cell; and applying a second voltage difference, substantially equal to the first voltage difference, across a second memory cell to be programmed while applying the first voltage difference across the first memory cell, wherein applying the second voltage difference comprises applying a second channel bias voltage to a channel of the second memory cell;

wherein the first channel bias voltage is different than the second channel bias voltage;

wherein the first memory cell and the second memory cell are commonly coupled to an access line and are at different locations along a length of the access line; and wherein the substantially equal first and second voltage differences occur at an end of a voltage pulse applied to the access line.

4. The method of claim 2, wherein the first control gate voltage is different than the second control gate voltage.

5. A method of programming, comprising:

applying a first voltage difference across a first memory cell to be programmed, wherein applying the first voltage difference comprises applying a first channel bias voltage to a channel of the first memory cell; and applying a second voltage difference, substantially equal to the first voltage difference, across a second memory cell to be programmed while applying the first voltage difference across the first memory cell, wherein applying the second voltage difference comprises applying a second channel bias voltage to a channel of the second memory cell;

wherein the first channel bias voltage is different than the second channel bias voltage;

wherein the first memory cell and the second memory cell are commonly coupled to an access line and are at different locations along a length of the access line;

wherein the first voltage difference comprises a voltage difference between a first control gate voltage on a control gate of the first memory cell and the first channel bias voltage, and wherein the second voltage difference comprises a voltage difference between a second control gate voltage on a control gate of the second memory cell and the second channel bias voltage;

wherein the first control gate voltage is different than the second control gate voltage; and wherein the difference between the first control gate voltage and the second control gate voltage is due, at least in part, to a voltage delay in the access line between the first memory cell and the second memory cell.

6. A method of programming, comprising:

applying a first voltage difference across a first memory cell to be programmed, wherein applying the first voltage difference comprises applying a first channel bias voltage to a channel of the first memory cell; and applying a second voltage difference, substantially equal to the first voltage difference, across a second memory cell to be programmed while applying the first voltage difference across the first memory cell, wherein applying the second voltage difference comprises applying a second channel bias voltage to a channel of the second memory cell;

wherein the first channel bias voltage is different than the second channel bias voltage;

wherein the first memory cell and the second memory cell are commonly coupled to an access line and are at different locations along a length of the access line;

wherein the first voltage difference comprises a voltage difference between a first control gate voltage on a control gate of the first memory cell and the first channel bias voltage, and wherein the second voltage difference comprises a voltage difference between a second control gate voltage on a control gate of the second memory cell and the second channel bias voltage; and wherein the first control gate voltage and the second control gate voltage are in response to applying a program voltage pulse to the access line.

7. The method of claim 6, wherein at least one of the first control gate voltage and the second control gate voltage is less than a voltage of the program voltage pulse, at least in part, due to a voltage delay in the access line.

8. The method of claim 6, wherein the first control gate voltage and the second control gate voltage occur at an end of the program voltage pulse.

9. A method of programming, comprising:

applying a first voltage difference across a first memory cell to be programmed, wherein applying the first voltage difference comprises applying a first channel bias voltage to a channel of the first memory cell; and applying a second voltage difference, substantially equal to the first voltage difference, across a second memory cell to be programmed while applying the first voltage difference across the first memory cell, wherein applying the second voltage difference comprises applying a second channel bias voltage to a channel of the second memory cell;

wherein the first channel bias voltage is different than the second channel bias voltage;

wherein the first memory cell and the second memory cell are commonly coupled to an access line and are at different locations along a length of the access line; and wherein the first memory cell is adjacent to a beginning of the access line and the second memory cell is adjacent to an end of the access line opposite to the beginning of the access line.

10. A method of programming, comprising:

concurrently applying first and second voltage differences respectively across first and second memory cells respectively having control gates commonly coupled to an access line;

wherein the first and second voltage differences respectively cause, at least in part, the first and second memory cells to be programmed at substantially a same speed;

wherein the control gates are at different voltages, at least in part, as a result of a voltage delay in the access line; and wherein concurrently applying the first and second voltage differences comprises concurrently applying a first channel bias voltage to a channel of the first memory cell and a second channel bias voltage to a channel of the second memory cell that is different than the first channel bias voltage.

11. The method of claim 10, wherein the first and second voltage differences are substantially equal.

12. The method of claim 10, wherein the first and second memory cells being caused to be programmed at substantially the same speed comprises a number of program voltage pulses required to program the first memory cell and a number of program voltage pulses required to program the second memory cell being within about ±1 program voltage pulse of each other for a voltage step size of about 0.2 volt.

13. The method of claim 10, wherein the first memory cell is adjacent to a beginning of the access line and the second memory cell is adjacent to an end of the access line opposite to the beginning of the access line.

14. The method of claim 10, wherein the first voltage difference comprises a voltage difference between the voltage on the control gate of the first memory cell and the first channel bias voltage, and wherein the second voltage difference comprises a voltage difference between the voltage on the control gate of the second memory cell and the second channel bias voltage, wherein the first and second channel bias voltages differ from each other by about a same voltage by which the voltages on control gates of the first and second memory cells differ.

15. A method of programming, comprising:
applying a program voltage pulse to an access line;
receiving a first voltage on a first control gate of a first memory cell in response to applying the program voltage pulse, the first control gate coupled to the access line;
receiving a second voltage on a second control gate of a second memory cell in response to applying the program voltage pulse, the second control gate coupled to the access line, the second voltage being different than the first voltage, at least in part, as a result of a voltage delay in the access line; and
respectively applying third and fourth voltages to channels of the first and second memory cells so that the first and second memory cells program at substantially a same speed.

16. The method of claim 15, wherein a difference between the first voltage and the third voltage and a difference between the second voltage and the fourth voltage at an end of the program voltage pulse are within about +0.2 volts of each other.

17. The method of claim 15, wherein a difference between the first voltage and the third voltage and a difference between the second voltage and the fourth voltage at an end of the program voltage pulse are substantially equal.

18. The method of claim 15, wherein the first and second control gates are respectively at the first and second voltages at an end of the program voltage pulse and wherein the channels of the first and second memory cells are respectively at the third and fourth voltages while the first and second control gates are respectively at the first and second voltages.

19. A method of programming, comprising:
applying a program voltage pulse to a beginning of an access line;
applying a first channel bias voltage to channels of a plurality of first memory cells targeted for programming, the plurality of first memory cells commonly coupled to the access line; and
applying a second channel bias, different than the first channel bias voltage, to channels of a plurality second of memory cells targeted for programming, the plurality of second memory cells commonly coupled to the access line;
wherein applying the program voltage pulse causes a first control gate voltage to be received on a control gate of at least one first memory cell of the plurality of first memory cells and a second control gate voltage to be received on a control gate of at least one second memory cell of the plurality of second memory cells;
wherein a difference between the first control gate voltage and the first channel bias voltage is substantially equal to a difference between the second control gate voltage and the second channel bias voltage; and
wherein the second control gate voltage is different than the first control gate voltage as a result of the first and second memory cells, at least in part, being at different distances from the beginning of the access line.

20. The method of claim 19, wherein the difference between the first control gate voltage and the first channel bias voltage and the difference between the second control gate voltage and the second channel bias voltage occur at an end of the program voltage pulse.

21. The method of claim 19, wherein the second control gate voltage being different than the first control gate voltage as a result of the first and second memory cells, at least in part, being at different distances from the beginning of the access line, comprises the second control gate voltage being less than the first control gate voltage as a result of the second memory cell, at least in part, being at a greater distance from the beginning of the access line than the first memory cell.

22. The method of claim 21, wherein the second channel bias is less than the first channel bias voltage.

23. The method of claim 19, wherein the difference between the first control gate voltage and the first channel bias voltage being substantially equal to the difference between the second control gate voltage and the second channel bias voltage, at least in part, causes the at least one first memory cell and the at least one second memory cell to program at substantially a same speed.

24. A memory device, comprising:
a controller;
wherein the controller is configured to cause the memory device to apply a first voltage difference across a first memory cell to be programmed, wherein the controller being configured to cause the memory device to apply the first voltage difference comprises the controller being configured cause the memory device to apply a first channel bias voltage to a channel of the first memory cell;
wherein the controller is configured to cause the memory device to apply a second voltage difference, substantially equal to the first voltage difference, across a second memory cell to be programmed while the first voltage difference is being applied across the first memory cell, wherein the controller being configured to cause the memory device to apply the second voltage difference comprises the controller being configured cause the memory device to apply a second channel bias voltage to a channel of the second memory cell;
wherein the first channel bias voltage is different than the second channel bias voltage; and
wherein the first memory cell and the second memory cell are commonly coupled to an access line and are at different locations along a length of the access line.

25. The memory device of claim 24, wherein the first voltage difference comprises a voltage difference between a first control gate voltage on a control gate of the first memory cell and the first channel bias voltage, wherein the second voltage difference comprises a voltage difference between a second control gate voltage on a control gate of the second memory cell and the second channel bias voltage, and wherein the control gates of the first and second memory cells are commonly coupled to the access line.

26. The memory device of claim 25, wherein the first control gate voltage is different than the second control gate voltage due, at least in part, to a voltage delay in the access line between the first memory cell and the second memory cell.

27. A memory device, comprising:
a controller;
wherein the controller is configured to cause the memory device to concurrently apply first and second voltage differences respectively across first and second memory cells respectively having control gates commonly coupled to an access line;
wherein the first and second voltage differences respectively cause, at least in part, the first and second memory cells to be programmed at a same speed;
wherein the control gates are at different voltages as a result of a voltage delay in the access line; and
wherein the controller being configured to cause the memory device to concurrently apply the first and second voltage differences comprises the controller being configured to cause the memory device to concurrently apply a first channel bias voltage to a channel of the first memory cell and a second channel bias voltage to a channel of the second memory cell that is different than the first channel bias voltage.

28. The memory device of claim 27, wherein the first and second voltage differences are substantially equal.

29. The memory device of claim 27, wherein the first and second memory cells being caused to be programmed at substantially the same speed comprise a number of program voltage pulses required to program the first memory cell and a number of program voltage pulses required to program the second memory cell being within about ±1 program voltage pulse of each other for a voltage step size of about 0.2 volt.

30. The memory device of claim 27, wherein the first voltage difference comprises a voltage difference between the voltage on the control gate of the first memory cell and the first channel bias voltage, and wherein the second voltage difference comprises a voltage difference between the voltage on the control gate of the second memory cell and the second channel bias voltage, wherein the first and second channel bias voltages differ from each other by about a same voltage by which the voltages on control gates of the first and second memory cells differ.

* * * * *